(12) United States Patent
Kuo

(10) Patent No.: US 6,633,000 B2
(45) Date of Patent: Oct. 14, 2003

(54) NOISE FILTER WITH AN IMPROVED INSULATING CASE

(75) Inventor: Peter Kuo, Chung-Ho (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 61 days.

(21) Appl. No.: 09/800,544

(22) Filed: Mar. 6, 2001

(65) Prior Publication Data

US 2002/0125034 A1 Sep. 12, 2002

(30) Foreign Application Priority Data

Feb. 23, 2001 (TW) ........................................ 90202774 U

(51) Int. Cl.[7] .............................. H01R 4/00; H04B 3/28; H01F 30/12
(52) U.S. Cl. ................................ 174/92; 333/12; 336/92
(58) Field of Search ............................ 174/74 R, 77 R, 174/79, 84 R, 92, 93; 333/12, 166, 175; 336/65, 175, 92

(56) References Cited

U.S. PATENT DOCUMENTS

| | | | | |
|---|---|---|---|---|
| 4,556,435 A | * | 12/1985 | Shibata ...................... | 148/6.35 |
| 4,970,476 A | * | 11/1990 | Kitagawa ...................... | 333/12 |
| 4,972,167 A | * | 11/1990 | Fujioka ........................ | 336/92 |
| 5,001,300 A | * | 3/1991 | Messelhi ...................... | 174/87 |
| 5,162,772 A | * | 11/1992 | May ............................. | 336/92 |
| 5,291,172 A | * | 3/1994 | Ito et al. ........................ | 336/65 |
| 5,355,109 A | * | 10/1994 | Yamazaki ...................... | 336/92 |
| 5,764,125 A | * | 6/1998 | May ............................. | 336/92 |
| 5,828,005 A | * | 10/1998 | Huynh-Ba et al. ............. | 174/92 |
| 5,900,796 A | * | 5/1999 | Parker .......................... | 336/92 |
| 5,942,964 A | * | 8/1999 | Takeuchi ...................... | 336/92 |

* cited by examiner

Primary Examiner—William H. Mayo, III
(74) Attorney, Agent, or Firm—Wei Te Chung

(57) ABSTRACT

A noise filter (100) includes a hollow ferrite core (10) for receiving a cable (200) therein and an insulating case (20) covering the ferrite core. The insulating case is made up of a pair of case members (21, 22) each of which defines a number of resilient ribs (231) and a number of support ribs (232) in an inner face (230) thereof. The resilient ribs have sharp-angled tops which provide a radial force for the ferrite core. A pair of latches (233) are formed on a side of each case member for engaging with corresponding recesses (235) defined in the other case member to couple the two case members. A front wall (251) and a rear wall (252) of each case member define a dented top side (253) thereof respectively, wherein a plurality of serrated protrusions (254) are formed on the dented top sides for securing the cable.

5 Claims, 6 Drawing Sheets

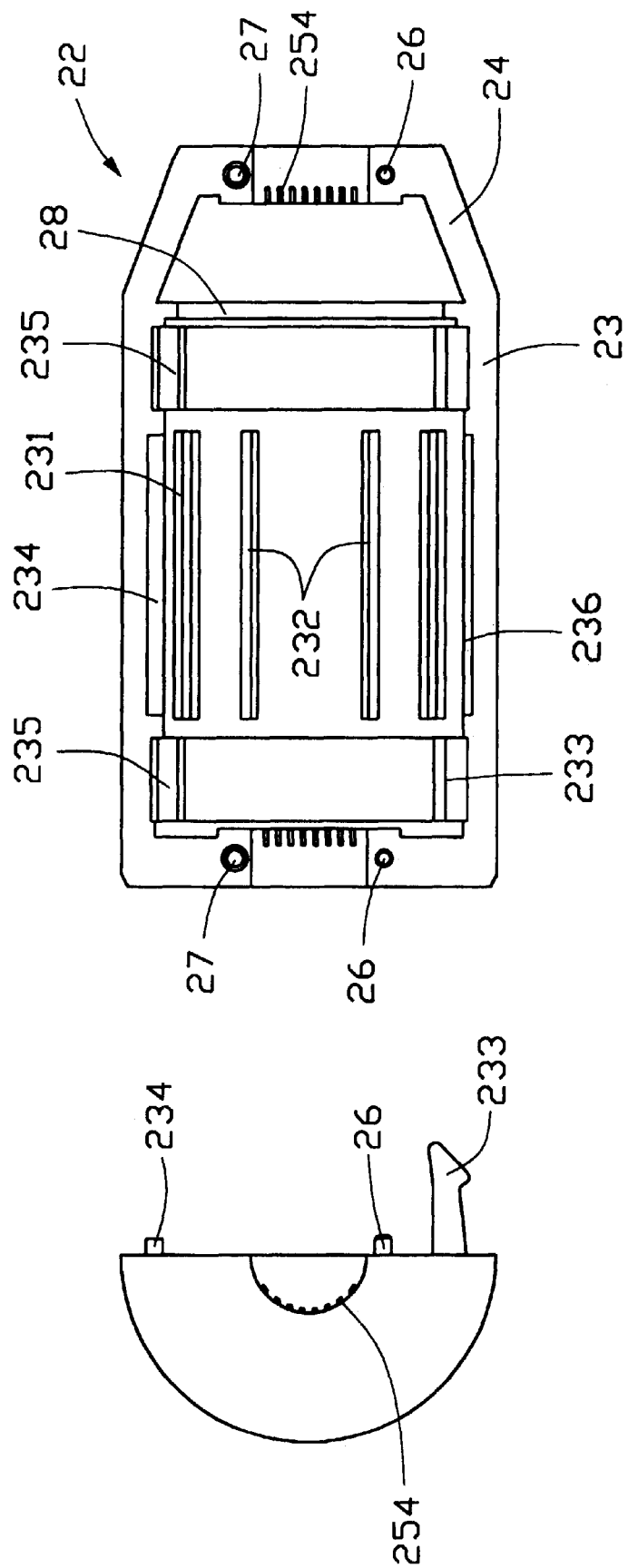

NOISE FILTER WITH AN IMPROVED INSULATING CASE

BACKGROUND OF THE INVENTION

1. Field of the Invention

The present invention relates to a noise filter and particularly to a noise filter with an improved insulating case member.

2. Description of the Related Art

A noise filter is commonly used on a cable such as a high frequency transfer line for preventing electromagnetic interference (EMI). Normally, the noise filter comprises a pair of ferrite core halves which form an opening therebetween for a cable to insert therethrough and a pair of insulating case halves for respectively containing the ferrite core halves therein. A hollow ferrite core member can be detachably received in a corresponding insulating case member or can be formed integrally with the insulating case member by an injection molding method. The former kind of engagement between the ferrite core member and the case member is achieved only by a bud on the case member which prevents the ferrite core from being deviated therefrom. However, there is a possibility that a relative displacement of the ferrite core member to the case member will be occurred during a severe environment. In this situation, the effect of the noise filter for shielding the cable from EMI is influenced. Moreover, the construction of integral core member and case member will add difficulties to manufacture as well as increase the cost of products.

Hence, a noise filter with an improved case member is required to overcome the above-described disadvantages.

SUMMARY OF THE INVENTION

Accordingly, one object of the present invention is to provide filter with an improved insulating case in which a hollow ferrite core for inserting a detachable cable therethrough is firmly secured and is protected from damage.

Another object of the present invention is to provide filter with an improved insulating case which can be manufactured easily and cost-efficient.

A further object of the present invention is to provide a noise filter with an improved insulating case by which a cable received therein is secured.

To achieve the afore-mentioned objects, a noise filter comprises a hollow ferrite core and an insulating case covering the ferrite core. The insulating case is made up of a pair of case members the configurations of which are substantially symmetrical. A plurality of resilient ribs with sharp-angled tops and a plurality of support ribs are interlaced in an inner face of each insulatingcase member for providing a radial force to the ferrite core. Each case member has a front wall and a rear wall on which a dented top side is formed respectively. A plurality of serrated protrusions are arrayed on the dented top sides for positioning and securing a cable received in a hole of the ferrite core.

Other objects, advantages and novel features of the invention will become more apparent from the following detailed description when taken in conjunction with the accompanying drawings.

BRIEF DESCRIPTION OF THE DRAWINGS

FIG. 4 is a front view of an insulating case member of the noise filter in accordance with the present invention;

FIG. 5 is a top plan view of the insulating case member of the noise filter in accordance with the present invention;

DETAILED DESCRIPTION OF THE INVENTION

Figure 1:
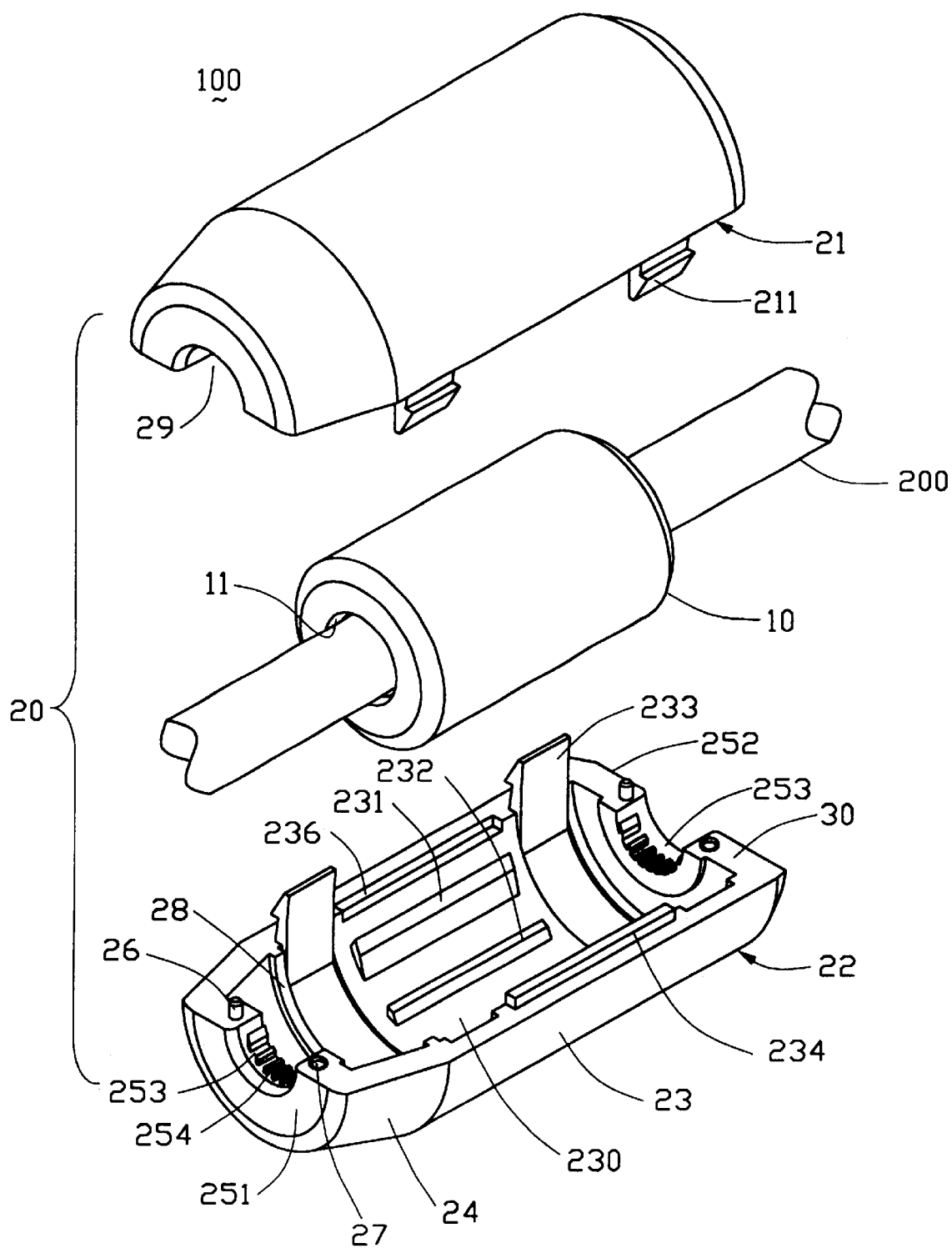
FIG. 1 is an exploded perspective view of a noise filter in accordance with the present invention.

Reference will now be made to the drawing figures to describe the present invention in detail.

Figure 2:
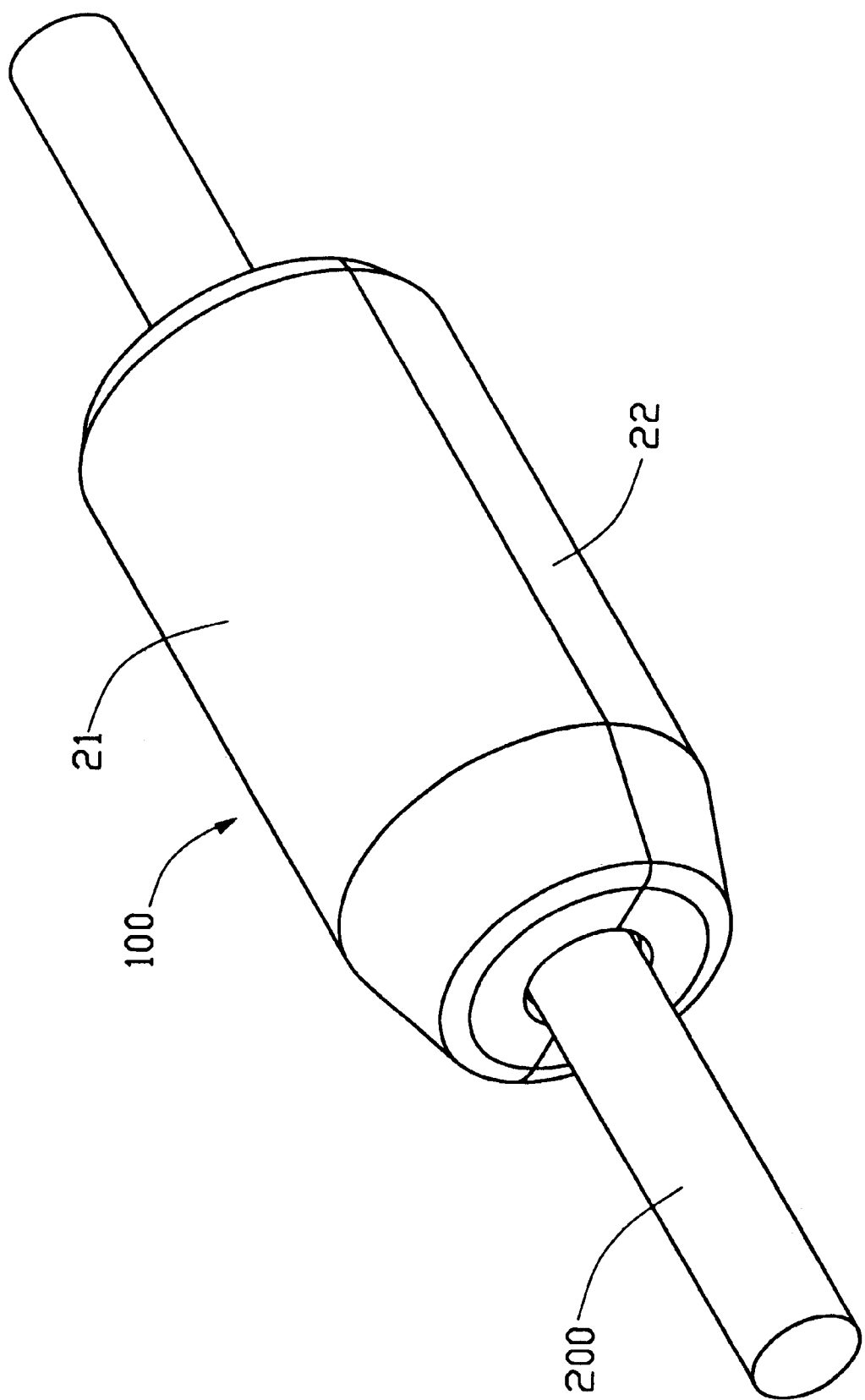
FIG. 2 is an assembled view of FIG. 1.
Figure 3:
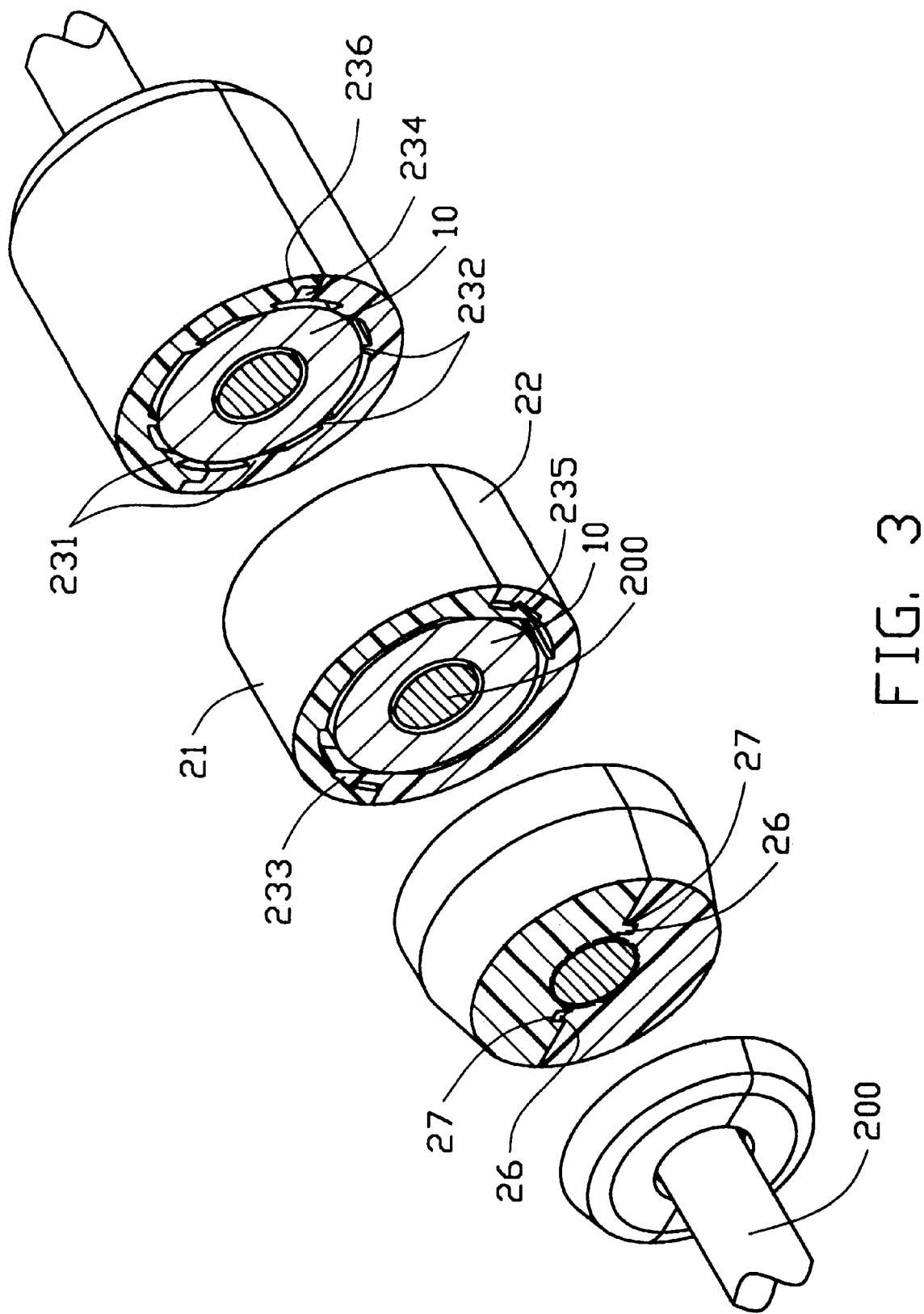
FIG. 3 is another sectioned perspective view of the noise filter in accordance with the present invention.
Figure 7:
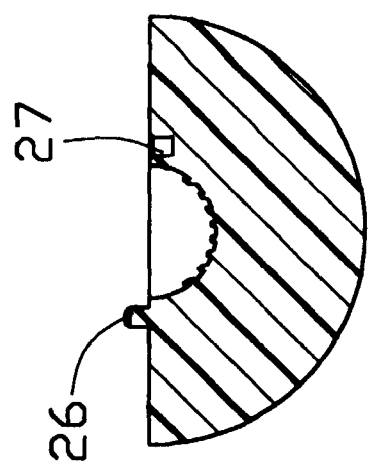
FIG. 7 is a cross-sectional view of the insulating case member taken along line 7—7 of FIG. 6.
Figure 6:
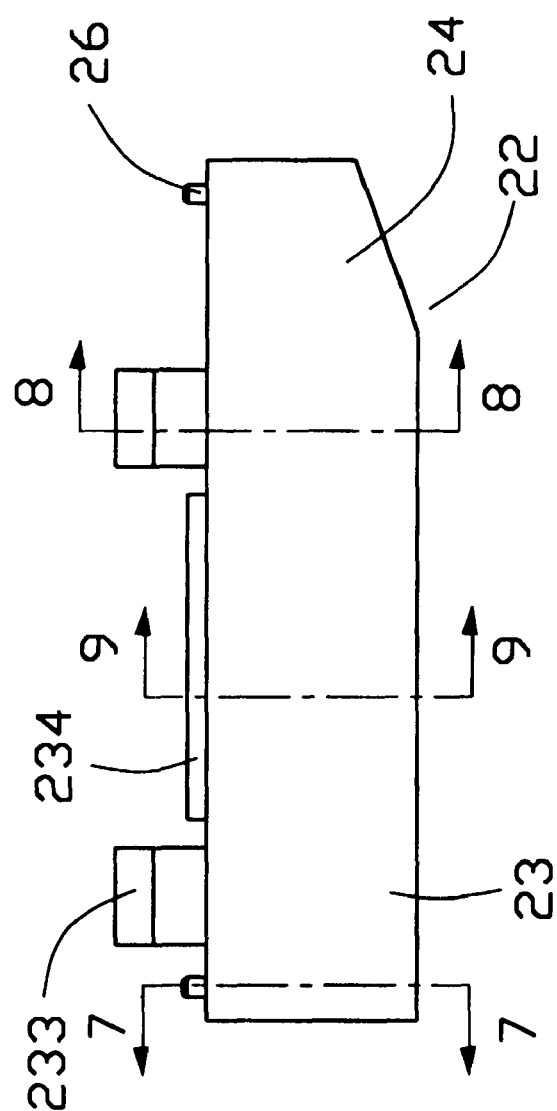
FIG. 6 is a side view of FIG. 5.
Figure 8:
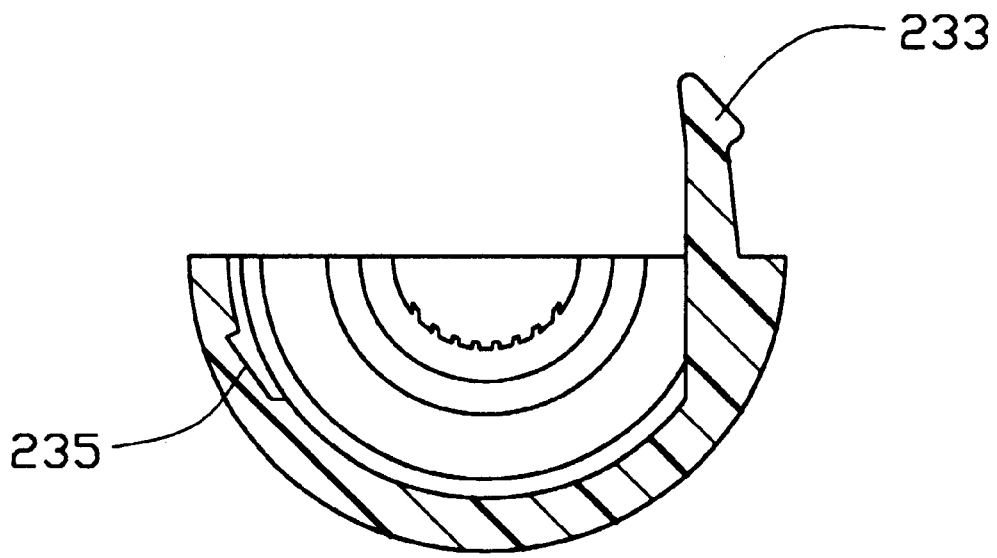
FIG. 8 is a cross-sectional view of the insulating case member taken along line 8—8 of FIG. 6.
Figure 9:
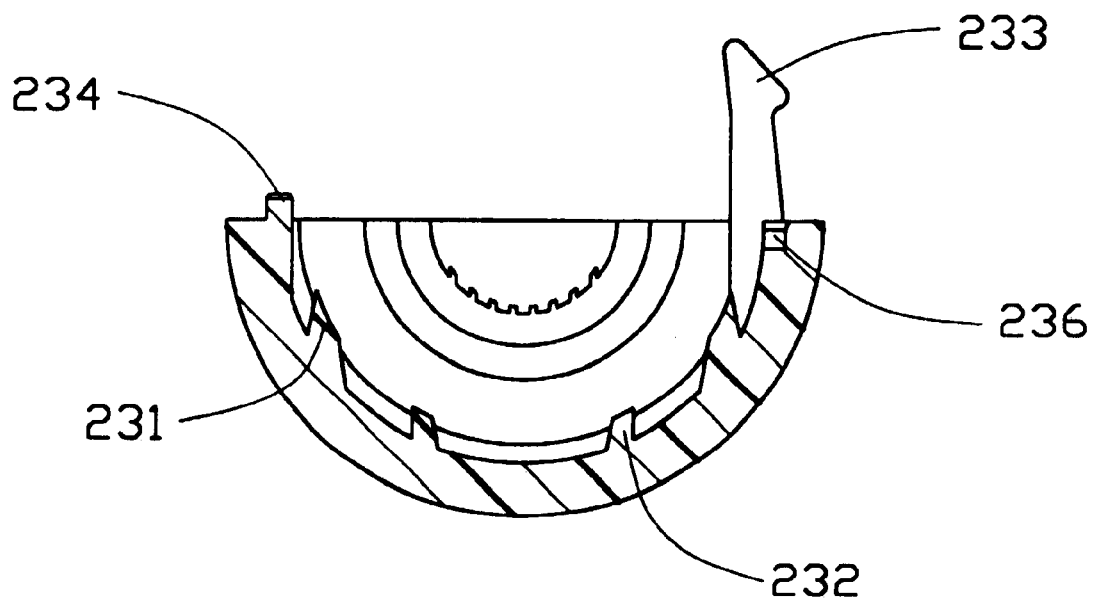
FIG. 9 is a cross-sectional view of the insulating case member taken along line 9—9 of FIG. 6.

Referring to FIGS. 1, 2 and 3, a noise filter 100, which is detachably mounted on a cable 200 such as a data transfer line or the like, comprises a hollow ferrite core 10 with a hole 11 for inserting the cable 200 therethrough and an insulating case 20 enclosing the ferrite core 10.

The insulating case 20 is made of plastic or like material and composed of a pair of insulating case members 21, 22 the configurations of which are substantially symmetrical. A receiving space 29 is defined in the insulating case 20 for receiving the ferrite core 10 and the cable 200. Each of the insulating case members 21, 22 comprises a main body 23 and a neck portion 24. The two insulating case members 21, 22 couple with each other through coupling surfaces 30 thereof. There is a bar 28 formed inside the insulating case member 22 between the main body 23 and the neck portion 24. Referring to FIGS. 4–9, the main body 23 forms a pair of latches 233 separately on one side thereof with a barb (not labeled) on a top of the latch 233 and defines a groove 236 between the pair of latches 233 on the coupling surface 30. On the other side of the main body 23, a beam 234 is formed opposite to the groove 236 for engaging with corresponding groove 236 defined on the other case member 21. A pair of inclined recesses 235 are defined in an inner face 230 of the main body 23 at the side opposite to the latches 233 for correspondingly coupling with the pair of latches 211 formed on the other insulating case member 21. A pair of resilient ribs 231 and a pair of support ribs 232 are formed in the inner face 230 of the insulating case member 22 along an axial direction, which are interlaced, i.e., the pair of support ribs 232 are situated between the pair of resilient ribs 231. A top of the resilient rib 231 is tapered as a sharp-angled free end portion for resiliently supporting the ferrite core 10. The support ribs 232 have rather gentle tops in contrast to the resilient ribs 231. The insulating case member 22 has a front wall 251 and a rear wall 252 each of which defines a dented top side 253 thereon. A plurality of serrated protrusions 254 are arrayed on the top sides 253 for positioning and securing the cable 200 received in the hole 11 of the ferrite core 10. On the coupling surfaces 30, the front wall 251 and the rear wall 252 respectively define a guiding post 26 and a recess 27.

In assembly, referring to FIGS. 1, 2 and 3, firstly, the cable 200 is inserted into the hole 11 of the ferrite core 10. Then, the cable 200 together with the ferrite core 10 is received in the receiving space 29 of the insulating case member 22. Finally, the other case member 21 couples with the case member 22 by means of the engagement between the latches 233, 211 and the inclined recesses 235. Simultaneously, the guiding posts 26 engage with the corresponding recesses 27 on the other case member 21 and the beam 234 engages with the corresponding groove 236. When the two insulating case members 21, 22 couple with each other, the resilient ribs 231 provide a radial resilient force for accurately positioning the ferrite core 10 in a center of the insulating case 20 and the support ribs 232 provide a support force for firmly securing the ferrite core 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A noise filter used on a cable for preventing electromagnetic interference (EMI), comprising:

a hollow ferrite core for extension of a cable therethrough; and an insulating case enclosing the ferrite core, the insulating case having a plurality of resilient ribs formed on an inner circumferential face thereof along an axial direction, the resilient ribs having sharp-angled top free ends for providing a radial force to elastically secure and accurately position the ferrite core in the insulating case;

wherein a plurality of support ribs are interlaced with the resilient ribs for firmly supporting the ferrite core.

2. The noise filter as described in claim 1, wherein the insulating case is made up of a pair of case members the configurations of which are substantially symmetrical.

3. A cable comprising:

a hollow ferrite core concentrically enclosing a cable therein; and an insulating case concentrically enclosing said ferrite core, said insulating case defining at least a pair of symmetric resilient axial ribs axially extending along and on an inner surface thereof and at least a pair of symmetric support axial ribs on the same inner surface interlaced with said resilient axial ribs; wherein said resilient ribs are configured to adjust and position a proper radial position of the ferrite core relative to the case while the support axial ribs supportably secure the ferrite core in the case.

4. The cable as claimed in claim 3, wherein each of said resilient ribs provides a larger contact surface with the ferrite core than that of said support ribs.

5. The cable as claimed in claim 3, wherein said case is defined by two halves, and the resilient ribs are positioned closer to coupling surfaces of the two halves than the support ribs.

* * * * *